United States Patent
Lamartine

(10) Patent No.: US 6,230,071 B1
(45) Date of Patent: *May 8, 2001

(54) DEPTH ENHANCEMENT OF ION SENSITIZED DATA

(75) Inventor: Bruce C. Lamartine, Los Alamos, NM (US)

(73) Assignee: The Regents of the University of California, Los Alamos, NM (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/653,638

(22) Filed: May 24, 1996

(51) Int. Cl.$^7$ ...................................................... G06F 19/00
(52) U.S. Cl. .......................... 700/166; 700/159; 700/166; 700/165; 250/201.4; 250/201.5; 428/64.1; 428/64.4
(58) Field of Search ..................................... 369/100, 153, 369/125, 34, 31; 357/23, 22, 90, 91; 428/64.1–64.6; 257/71, 68, 284; 250/201.4, 201.5; 156/643.1, 647.1, 651.1, 662.1

(56) References Cited

U.S. PATENT DOCUMENTS

| | | | |
|---|---|---|---|
| 3,908,183 | * | 9/1975 | Ennis, Jr. ................................. 357/65 |
| 4,112,455 | * | 9/1978 | Seliger et al. .......................... 357/23 |
| 4,212,455 | * | 7/1980 | Selgier et al. .......................... 357/23 |
| 4,513,494 | * | 4/1985 | Batra ....................................... 29/576 |
| 4,687,710 | * | 8/1987 | Ogawa et al. .......................... 428/447 |
| 4,801,558 | * | 1/1989 | Simmons et al. ...................... 437/170 |
| 4,999,234 | * | 3/1991 | Cowan ..................................... 428/15 |
| 5,204,627 | * | 4/1993 | Mistretta et al. ...................... 324/409 |
| 5,264,712 | * | 11/1993 | Murata et al. .......................... 257/71 |
| 5,335,243 | * | 8/1994 | Kubena et al. .......................... 372/99 |
| 5,348,609 | * | 9/1994 | Russell et al. .......................... 156/345 |
| 5,350,662 | * | 9/1994 | Chi .......................................... 430/313 |
| 5,354,420 | * | 10/1994 | Russell et al. .......................... 156/643 |
| 5,380,546 | * | 1/1995 | Krishnan et al. .................... 427/126.1 |
| 5,401,972 | * | 3/1995 | Talbot et al. ........................ 250/491.1 |
| 5,402,410 | | 3/1995 | Yoshimura et al. ............... 369/275.1 |
| 5,460,679 | * | 10/1995 | Abdel-Kader ....................... 156/275.5 |
| 5,500,079 | * | 3/1996 | Nishizawa et al. ................ 156/643.1 |
| 5,501,822 | * | 3/1996 | Kubena et al. ....................... 264/1.37 |
| 5,559,057 | * | 9/1996 | Goldstein ............................. 437/228 |
| 5,572,507 | * | 11/1996 | Ozaki et al. ...................... 369/275.4 |
| 5,585,288 | * | 12/1996 | Davis et al. ........................... 437/38 |
| 5,616,510 | * | 4/1997 | Wong .................................. 438/259 |
| 5,721,687 | | 2/1998 | Lamartine et al. ............. 364/474.08 |
| 5,757,409 | * | 5/1998 | Okamoto et al. ..................... 347/230 |
| 5,764,001 | * | 6/1998 | Khan et al. .......................... 313/582 |
| 5,773,116 | * | 6/1998 | Lamartine et al. ................. 428/64.1 |
| 5,895,225 | * | 4/1999 | Kidoguchi et al. .................... 438/47 |

OTHER PUBLICATIONS

K. M. Edenfeld et al., American Vacuum Society, 1994, pp. 3571–3575.

U. S. Patent Application Ser. No. 08/382,345 by Bruce C. Lamartine et al.

* cited by examiner

Primary Examiner—Paul P. Gordon
Assistant Examiner—Ramesh Patel
(74) Attorney, Agent, or Firm—Bruce H. Cottrell

(57) ABSTRACT

A process of fabricating a durable data storage medium is disclosed, the durable data storage medium capable of storing, digital or alphanumeric characters as well as graphical shapes or characters. Additionally, a durable data storage medium including a substrate having etched characters therein is disclosed, the substrate characterized as containing detectable residual amounts of ions used in the preparation process.

6 Claims, 4 Drawing Sheets

DEPTH ENHANCEMENT OF ION SENSITIZED DATA

This invention is the result of a contract with the Department of Energy (Contract No. W-7405-ENG-36).

FIELD OF THE INVENTION

The present invention relates to a process of forming data storage media and to articles prepared by such a process such as high density durable data storage media.

BACKGROUND OF THE INVENTION

The storage of information or data has seen revolutionary changes in the past century, yet the long term storage and interpretation of such data may present an important problem. Rothenberg, Scientific American, pp. 42–47, 1995, describes the problems associated with the longevity of documents.

The storage of information or data storage has commonly involved the use of magnetic or optical recording carriers. Recently, the use of scanning tunnel microscopes (STM's) has been investigated for the writing and reading of storage information by means of topographical changes to flat metal surfaces. Wiesendanger, J. Vac. Sci. Technol. B, v. 12, no. 2, pp. 515–529 (1994), reviews STM and similar scanning probe microscopy in fabrication of nanometer-scale structures and the unresolved problems of the limited temporal stability of such nanometer-scale structures. Other similar references include: Adamchuk et al., Ultramicroscopy v. 45, pp. 1–4 (1992), describing the use of an STM to microprocess nanometer-sized craters of about 50 nanometers (nm) in diameter and 10 nm in depth in gold films on flat silicon substrates; Li et al., Appl. Phys. Lett., v. 54, no. 15, pp. 1424–1426 (1989), describing electroetching nanometer-sized craters about 2 nm in diameter and up to about 1 nm in depth in flat gold substrates with a STM operating in air; Silver et al., Appl. Phys. Lett., v. 51, no. 4, pp. 247–249 (1987), describing the direct writing of submicron metallic features by deposition of a new substance (cadmium from organometallic gas) on a surface with a STM; and, Abraham et al., IBM J. Res. Develop v. 30, no. 5, pp. 492–499 (1986), describing surface modification with a STM via surface diffusion and mention the possibility of high density memory storage. The present data storage systems each suffer from one or more problems including the long term stability or durability of the medium.

U.S. patent application Ser. No. 08/382,345, now U.S. Pat. No. 5,721,687 entitled "Ultrahigh Vacuum Focused Ion Beam Micromill and Articles Therefrom", by Lamartine et al. describes the use of a focused ion beam in combination with an ultrahigh vacuum to obtain milled articles having a high aspect ratio. While this process could prepare suitable durable data storage media, the process was slow.

It is an object of this invention to provide a rapid process of forming durable data storage media such a process involving the use of an etch enhancement or an etch stop technique.

It is another object of this invention to provide articles of manufacture formed by the present process, such articles including, e.g., durable data storage media, such articles of manufacture containing detectable residual amounts of ions initially used in the preparation process.

SUMMARY OF THE INVENTION

To achieve the foregoing and other objects, and in accordance with the purposes of the present invention, as embodied and broadly described herein, the present invention provides a process of preparing a data storage media within a target substrate including placing a target substrate within an vacuum environment, producing a computer data file adapted for operation of a computer-controlled focused ion beam during exposure of a target substrate, exposing the target substrate to the computer-controlled focused ion beam, the computer-controlled focused ion beam controlled by software utilizing the computer data file whereby said target substrate has defined portions including measurable dosages of implanted ions, and placing said target substrate having defined portions including measurable dosages of implanted ions in an etchant for time sufficient to form a resultant durable data storage medium.

The present invention further provides a durable data storage medium comprising a substrate having etched characters therein, said substrate further characterized by the presence of detectable residual amounts of ions initially used in the preparation process. The storage medium can include etched characters selected from the group consisting of digital characters, alphanumeric characters, glyphical characters and 3-D graphical characters, and halftone and greyscale pictures.

DETAILED DESCRIPTION

Figure 1A:
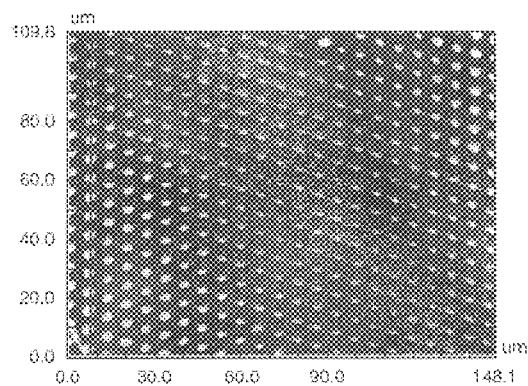
FIG. 1 shows an array of alternating "1" (ion exposure) aand "0" (no exposure) with a negative image of pit height about 34 nanometers.

The present invention is concerned with a process for small-scale fabrication down to the nanometer-scale and to articles fabricated by this process. In the present process, small-scale fabrication involves an initial step where a target substrate is exposed to a controlled ion beam under a vacuum whereby some amount of ions are deposited within the substrate, followed by an etching step-where the target substrate is placed in an etchant for time sufficient to form a resultant microstructure.

The vacuum in which the target substrate is exposed to a controlled ion beam, may be a high vacuum, i.e., a vacuum of less than about $10^{-6}$ Torr, an ultrahigh vacuum, i.e., a vacuum of less than about $10^{-9}$ Torr, or a super high vacuum in the range of from about 50 to about 120 picoTorr ($6.3 \times 10^{-11}$–$1.6 \times 10^{-10}$ millibar).

Preferably, the fabrication process of the present invention can be used for the recording of data upon a suitable substrate. Such data can be recorded as characters upon the substrate using, e.g., digital or numeric characters, alphabetic or alphanumerical characters, and graphical or glyphical characters, i.e., characters in the form of a three dimensional (3-D) graphic or picture. By "character" is generally meant any symbol representative of a writing or communicative system and within the present process of recording data it can include any feature distinguishable from the surface background of the substrate. A binary system of recording data can also be employed wherein a binary data character is represented by a single surface depression upon the substrate or by the absence of such a single surface depression upon the substrate. An analog data system can also be formed in which a greyscale or halftone picture can be converted to a control file wherein each pixel's dwell time corresponds proportionately to its source greyscale value. When read back by a phase sensitive optical microscope, such as a Mirau interferometer, or other suitable reader such as a Nomarski microscope, a greyscale image is observed. The spatial position and greyscale value of each interferometer image pixel is then captured on a CCD camera with frame grabber and subsequently processed for color by colorizing; e.g., assigning a unique color value in a bitmap from a lookup table which contains the greyscale values. The fabrication process of the present invention may also be used for fabrication of, e.g., beams, levers, capacitors, lenses, diffraction gratings, waveguides, bandpass filters, antennas, and fasteners.

In the present process, the ion beam can include ions such as gallium, tin or indium or other conventional ions generally used in commercial ion beams. Preferably, gallium is employed as the ions in the ion beam with the result that gallium ions are implanted within the target regions of the substrate. Gallium is preferred as it allows room temperature operation of a focused ion beam.

Depending upon the dose level of ion implanted in the substrate, the portion of the substrate with the implanted ions will have either an enhanced etch rate or a decreased etch rate. With dosages of at least about $1.7 \times 10^{12}$ ions per square centimeter, the implanted area will have an enhanced etch rate to the selected etchant. At higher dosages of at least about $1.0 \times 10^{14}$ ions per square centimeter, the implanted area will serve as an etch stop and will have substantially lower or decreased etch rates. Thus, depending upon the amount of ions implanted, a defined area can etch more quickly than surrounding areas such that the etched characters will be depressions and appear as a positive type character, or the defined area can etch more slowly than the surrounding areas such that the etched background will be the depressions or the characters will be left as protrusions and appear as a negative type character. Positive greyscale images are best obtained with dosages of from about $2.8 \times 10^{13}$ to about $6.8 \times 10^{13}$, dosages whereat the resultant depth is related linearly to the ion dosage such that a linear density greyscale is obtainable.

After a target substrate is exposed to the focused ion beam whereby ions are implanted within the substrate, the target substrate is placed within an etchant for sufficient time that an etch profile in the substrate can be achieved. Typical etchants can include sodium hydroxide, a mixture of potassium hydroxide and an alcohol such as isopropanol, phosphoric acid and hydrochloric acid. Choice of etchant can be dependent upon the choice of substrate. For example, with gallium arsenide as the substrate, hydrochloric acid is the preferred etchant. For substrates such as silicon, sodium hydroxide is the preferred etchant.

The resultant product after the process of the present invention is characterized as containing detectable residual amounts of the ions implanted during the preparation process of the resultant durable data storage article. Additionally, the resultant product has an altered optical reflectivity when examined by Mirau interferometry or laser amplitude reflection and an altered secondary electron yield when the written area is struck by an ion beam or electron beam and the resulting output from the original ion implanted area is compared to the output from areas not originally implanted with ions.

Figure 7:
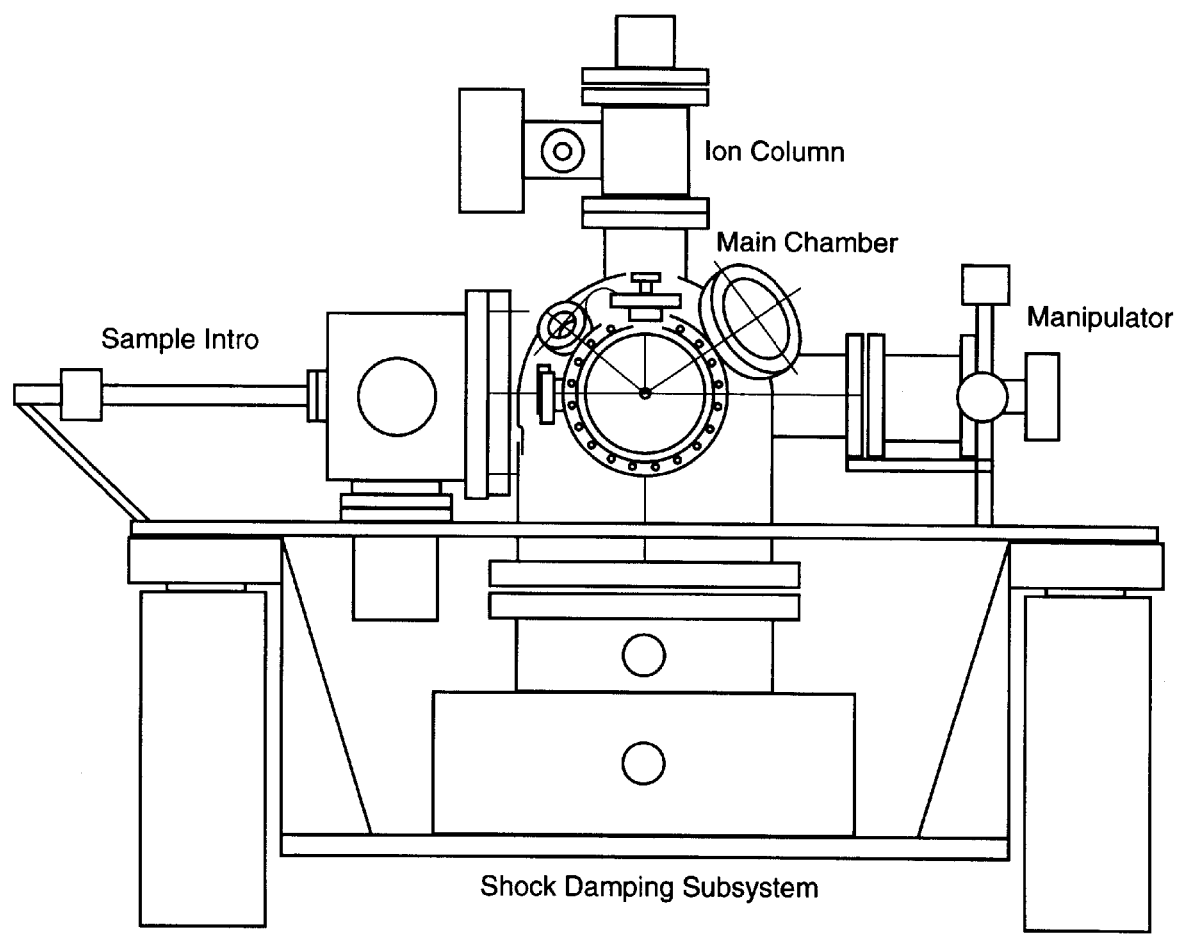
FIG. 7 shows a top view of a focused ion beam system used in the process of the present invention.

A chamber employing a focused ion beam system employable in the practice of the present process or in forming the data storage media is shown in FIG. 7. In FIG. 7, a vacuum chamber 10 includes a number of ports for viewing of the target substrate, for filming of the target substrate, for insertion or manipulation of the target substrate, and for various analyses of the target substrate such as from secondary electron emission. One port can be a view port with another port being used for a camera port. Other view ports can serve as a roughing pump port or contain the ion beam gun driven by appropriate software. Multiple ion beam guns may be used if desired to speed additional ion implanting.

Among the substrate materials in which data can be formed by the fabrication process of the present invention are included metals such as copper, aluminum, titanium, tungsten, tantalum, molybdenum, nickel, gold, silicon (of orientation such as 100, 111 or 110), silica, gallium arsenide, or silicon nitride.

In one embodiment of the fabrication process of the present invention, the fabrication process can be used for data storage upon, e.g., metal and semiconductor materials. Such data storage can be of high density and can be highly durable. By "high density", it is meant that an area of substrate of about 0.2 square inches (equivalent to a small dowel-shaped medium of about $\frac{1}{16}$ inch in diameter and about 1 inch in length) containing etched characters of about one square micron can hold up to about 1 gigabyte of ASCII information if it is assumed that each Latin character is equivalent to 8 bits or 1 byte. An equivalent binary representation would, by comparison, allow 4 gigabytes of information to be written in the same space.

The data storage media of the present invention offers an extremely durable media for the storage of data with such media generally capable of surviving electromagnetic pulses, radio-frequency (RF) interference, magnetic fields, exposure to common solvents including but not limited to water, alcohols and acetone, thermal gradients and fires. The data storage media can offer advantages of high reliability in comparison to magnetic/magneto-optical media thereby reducing the need to replace backup data, can offer a low capital cost for storage data in terms of the actual substrate, e.g., a silicon wafer can serve as the actual storage material for etching of the data. Other advantages of such data storage media can be that there should not be embrittlement of the medium over time, and that the medium can be recycled or reused if desired by grinding and polishing of the medium.

In one embodiment of the data storage application of the present process, a suitable substrate can be formed into a preformatted media by pre-forming a series of individual surface depressions representative of one type of binary characters, i.e., either ones or zeros. In one manner of accelerating the process of subsequent data storage system, the pre-formed substrate can be backfilled with an overcoat material characterized as more easily and quickly removable than the substrate material itself, but durable and resistant to inadvertent degradation of the overcoat material. The overcoat material can then be removed only for those characters needed to change the binary character representation. In another manner, pre-casting of a series of individual bumps representative of one type of binary characters, i.e., either ones or zeros can be formed upon a suitable substrate. Such pre-casting can use a material such as polyvinyl alcohol, polystyrene, and spin-on glass in thicknesses, e.g., of up to about 75 microns. Then, the requisite bumps of the pre-cast material can then be removed only for those characters needed to change the binary character representation.

One problem typically associated with the long term storage of data relates to the methods that will be used to read the data hundreds to thousands of years after it is written. The benefit of the present fabrication process for data storage is that it allows the storage of data in several formats and densities upon the same media. For example, the protocol used to store the data can be written at one data density (size) that could be man-readable with simple tools or even by simply vision or minor magnification. Then, the protocol could be used to read the remaining data written at the higher density (small size) and in a different format. Thus, in effect a type of "Rosetta Stone" can be created that allows the decoupling of information from storage and retrieval methods and provides the necessary key to be used to read the stored data far into the future. In contrast to the original "Rosetta Stone", the present data storage medium uses different sizes of information rather than just one, and the present data storage medium does not repeat the actual data but simply provides a key for reading the remaining data.

The data storage system of the present invention can allow for the storage of multiple types of information in a single storage medium, i.e., both alphanumeric and graphical or glyphical characters can be formed into a single substrate and both types of information can then be retrieved. In another manner, various sizes of characters can be formed into a single substrate. Among the various sizes can be included small sizes targeted for the efficient storage of large amounts of data as well as large sizes targeted for visual observation by the unaided human eye. In this manner, large amounts of data can be stored on a substrate, yet it would be apparent to an individual seeing the data storage system at some later date, even much later in the future, that there was information stored upon the substrate. Further, large size instructions regarding how to read the small size characters can be included directly upon the substrate. The small size characters can then be included in the remaining area of the substrate around the large size structures or may even be included within the formed areas of the larger size characters.

In the process for data storage, three separate procedures can be employed for the production of digital, alphanumeric, and 3-D dimensional image data. All procedures ultimately produce a file called a millstream file which can be read and rapidly processed by a commercial digital-to-analog converter. The file is of the form:

s nf t[1]x[1]y[1]

.

.

.

t[np]x[np]y[np], where
s=3-dimensional mode designator; nf=number of frame repetitions; np=total number of data lines; t[i]x[i]y[i] t[i]=beam dwell time in nanoseconds; x[i] =horizontal position in digital-to-analog converter units (0–4095); and, y[i]= vertical horizontal position in digital-to-analog converter units (0–4095). The entries s, nf and np are collectively known as the millstream header. Note that the digital and alphanumeric data modes employed are actually restricted cases of 3-dimensional image forming. Separate software can be used for simple line and box milling, and such software available as Ionmill Version 2.5 from FEI Co.

Processing of digital data for control of the ion implanting can be as follows: Digital data can be first derived mathematically or read in by Mathcad 4.0, a commercial numerical and graphics package using the following software developed to run within Mathcad. For example, the following array of alternating ones and zeros was used to generate a digital array of corresponding ion beam dwell times:

$$F = \begin{bmatrix} 0 & 1 & 0 & 1 & 0 & 1 & 0 & 1 \\ 1 & 1 & 1 & 1 & 1 & 1 & 1 & 1 \\ 0 & 1 & 0 & 1 & 0 & 1 & 0 & 1 \\ 1 & 1 & 1 & 1 & 1 & 1 & 1 & 1 \\ 0 & 1 & 0 & 1 & 0 & 1 & 0 & 1 \\ 1 & 1 & 1 & 1 & 1 & 1 & 1 & 1 \\ 0 & 1 & 0 & 1 & 0 & 1 & 0 & 1 \\ 1 & 1 & 1 & 1 & 1 & 1 & 1 & 1 \end{bmatrix}$$

Test patterns can be generated for subsequent use in ion implanting. For example, the digital array mentioned above can be created in the software example below:

Set up calculation indices:

$n := 4 \ m := n \ i := 0...n \ j := 0...m \ q := (n+1) \cdot (m+1) \ k := 0...q-1$ Create the digital array (other formulae may be substituted):

$D_{i,j} := \text{if} \ [[(-1)^i > 0] \cdot [(-1)^j > 0], 0, 1]$

Create the dwelltime map:                Logical "and" operation:

$T_{i,j} := \text{if} \ (D_{i,j} \neq 1, -100, -1)$                $E_{i,j} := 1 \ F_{i,j} := D_{i,j} \cdot E_{i,j}$ Create an X,Y array:

$X_{i,j} := \text{floor}\left(\frac{4095 \cdot i}{n}\right)$   $WRITE(X) := X_{i,j}$   $Mx_k := READ(X)$ $Y_{i,j} := \text{floor}\left(\frac{4095 \cdot j}{n}\right)$   $WRITE(Y) := Y_{i,j}$   $My_k := READ(Y)$   $Mxy = augment(Mx, My)$ Create the mill file of dwell (x, y) in DAC units:

$WRITE(T) := T_{i,j} \ Mt_k := READ(T) \ Mtxy := augment(Mt, Mxy) \ rows(Mtxy) = 25$ $PRNCOLWIDTH := 0 \ PRNPRECISION := 4 \ WRITEPRN(NGRATE2) := Mtxy$ Variations of this example were obtained by adjusting values or parameters of n, m, D, T, and E. These intermediate files(e.g., NGRATE2.prn) are left-justified and only a single space separates t,x,y values. This is the file structure required by the commercial ionmill software package from FEI Co. Subsequent file processing requires the removal of the minus signs, a left registry shift, and the attachment of the appropriate header. It proved most convenient to write a conversion routine in BASIC to produce the final mill file xxx.str from the intermediate xxx.prn file.

An example of a preferred file conversion routine for conversion of a Postscript rendered bitmap to a linearly resolved contrast greyscale CAM control file is shown below.

```
$compile exe
$CPU 80286
$float npx
100 CLS
shell "delepsf.bat"
SCREEN 9: COLOR 14, 9
PRINT "←----------------------------------------------→"
PRINT "<_____PS2MSTR7 by Bruce C. Lamartine _____>"
PRINT "
PRINT "This program reads a 256 greyscale postscript file xxx.eps"
PRINT "and produces as many 262 K vectorized xxx.str patterns as"
PRINT "required from an 8.5 × 11 page digitalized @ 300–333 dpi."
PRINT "This version contains RAMDISK access, batch file writedown,"
PRINT "and greyscale correction for etch stop doping..............................."
PRINT
PRINT "Enter a Postscipt filename from drive E:"
INPUT "(Existing file only: no .EPS extension, please)": filen$
PRINT
REM Copy file from Bernoilli up to RAMDISK
flnmcyup$="copy e:¢olorlab[|]P' + filen$ + ".eps f:[|]P'
shell flnmcyup$
drive1$="F:\"
drive2$="G:\"
drive3$="H:\"
flnmcyup$=drive1$+filen$=".eps":PRINT SPC(%) :filenmeps$
INPUT" Enter the number of frames (e.g., 5) per pattern;nframes$
PRINT
INPUT" Enter the minimum dwell value(129)";dwmin
INPUT" Enter the maximum dwell value(224)";dwmax
PRINT
INPUT" Enter the pattern mag factor..(1–4)";mag
PRINT
INPUT "Continue? (y/n)", go$
IF go$ = "n" OR go$ = "N" THEN GOTO 1000
CLS
OPEN filenmeps$ FOR INPUT AS #1
      REM turn on timer
      t1=0
      t2=0
ON TIMER(1)GOSUB 2000
TIMER ON
      REM turn on timer, set eps line and mill line counters to zero
      T = TIMER
      k = 0
DO UNTIL EOF(1)
110 LINE INPUT #1, epsin$
      IF epsin$="showpage" THEN GOTO 120
      k=k+1
        IF k<14 GOTO 110
        -IF k=14 THEN w=LEN(epsin$)*0.5
120 LOOP
      CLOSE #1
      CLS
      LOCATE 2,1
          PRINT" x(#pts/line)= ",w
      LOCATE 3,1
          PRINT" y(#lines)= ",k–13
      LOCATE 4,1
      PRINT" Total points before vectorizing=",w* (k–13)
      LOCATE 5,1
PRINT" Estimated processing time (sec)=",INT((w*k–13)/262144)*40)
      LOCATE 6,1
          PRINT" Elapsed time (sec)="
          View (330,69) – (395,84),8,14
          x=w
      y=k–14
      xspan=w–1
      yspan=y–1
      OPEN filenmeps$FOR INPUT AS #1
```

-continued

```
REM  Start line input. K=#lines->value of y
REM  Write first millstream header
        k=0
        p=0
        patnum=0
        GOSUB 3000
DO UNTIL EOF(1)
150    LINE INPUT #1,epsin$
        IF epsin$="showpage" THEN GOTO 200
            k=k+1
            IF k,14 GOTO 150
REM  Convert greyscale values from hex
REM  Count total # of values=n/2
REM  Also count subtotal of sieved values = p
REM  Redefine y before the following loop
        y=k-14
REM  sumt2l=0
        FOR n=1 TO LEN(epsin$) STEP 2
            t3$="&H"+MID$ (epsin$,n,2)
            t21=abs (val (t3$)-255)
REM  This procedure increments the loop index without
REM  incrementing the sieve counter. We also assign a
REM  a greyscale etch correction filter to the data.
            if t21,1, then goto 190
            t21=int ( ( (dwmax-dwmin)*t21/255) =dwmin)
185        t21$=STR$(t21)
REM  DAC calculation
            xn=2047+( (n-xspan)*0.5)*mag
            yk=2047+( (y-yspan)*0.5)*mag
REM  Skew correction. Don't use if not needed
REM  xshftn=INT (xn-yk*.1305262)
REM  yshftk=INT(yk*.9914449)
REM  txy$=t21$+STR$ (xshftn) +STR$ (yshftk)
        txy$=t21$+STR$ (INT(xn) ) +STR$ (INT(yk))
        1txy=LEN(txy$)
        mtxy$=RIGHT$ (txy$, 1txy-1)
        PRINT #2, mtxy$
REM  increment sieve counter if greyscale value is acceptable
        p=p+1
        IF p<262145 THEN GOTO 190
            CLOSE #2
        p=0
        GOSUB 3000
190    NEXT n
200    LOOP
        GOSUB 4000
TIMER OFF
        done$=filenmstr$+"Complete"
        LOCATE 11,29
        PRINT done$
        PRINT
        CLOSE #1
        CLOSE #2
        LOCATE 12,29
REM  Move *.str files on ramdisks to removable disk e:
        shell "mvramg.bat"
        if patnum>8 then; shell "mvramh.bat
BEEP
BEEP
BEEP
INPUT "Do another? (y/n)" G$
IF G$="n" OR G$="N" THEN GOTO 1000
GOTO 100
1000 END
2000   REM Elapsed time subroutine
        tnew=TIMER
        telapsed=INT (tnew-T)
            LOCATE 6,43
            PRINT USING "######";telapsed
        RETURN
3000   REM Millstream Header Subroutine
REM  Open new file and write header
        SOUND 1200,1
        SOUND 1400,1
        SOUND 1600,1
            patnum=patnum+1
REM Change ramdisks when full. Don't use if not needed. Runs faster.
REM New version-moves str file from RAMDISKS g: and h: to removable
disk e:
```

-continued

```
        if patnum>8 then drive2$=drive3$
        patnum$=STR$ (patnum)
        1ptnum=LEN (patnum)
        ptnum$=RIGHT$ (patnum$, 1ptnum−1)
        filenmstr$=drive2$+filen$+ptnum$+". str"
        LOCATE 10,6
          PRINT "Working on:",filenmstr$
        OPEN filenmstr$ FOR OUTPUT AS #2
        PRINT #2, "s"
          PRINT #2,1trim$(str$(nframes))
        PRINT #2, "262144"
        RETURN
4000  REM Finish final millstream file with dummy "1" entries
REM   which park the beam at the corner of the frame.
        FOR q=p TO 262144
        ntxy$="1"+""+"4095"+""+"4095"
        PRINT #2, ntxy$
        NEXT q
        RETURN
```

Alternatively, any text editor package can be used to convert files for this purpose. Convenient packages include the "Find and Replace" features of Microsoft Word for Windows, Version 2.0. Typically, the "find" operation can locate, e.g., "−" and the "replace all" operation can be used to convert to " ". The left registry shift can then be accomplished automatically. Then, the processed file can be stored as xxx.txt and finally, the millstream header is attached to the xxx.txt file and stored as xxx.str, a file compatible with FEI Co. Ionmill software Version 2.5.

Alphanumeric data such as man-readable characters, exposure masks, business card logos, or any item which can be placed in a flatbed scanner to produce a greyscale image, or any video frame grabber output falls into this category. In general, the processing scheme is to (1) scan the item (e.g., a textbook page) and electronically crop out the relevant image area; (2) enhance the contrast in the selected area; (3) convert to a black and white image; (4) save the converted image as, e.g., a PostScript file; (5) remove the header and footer from the PostScript file and save as an ordered Mathcad file; (6) assign dwell times to the dark areas (e.g., black printed text); (7) vectorize the file (i.e., remove data from the unnecessary white areas); (8) produce a final millstream file using the method described above for digital data.

Operations (1)–(4) can be carried out in a commercial scanner package called Colorlab Version 4.0 With an Epson ES-300-C flatbed scanner with IBM-PC adapter using menu functions. Operation (5) can be done in Microsoft Word for Windows Version 2.0 using the Delete function(s). Operations (5)–(6) can be done using additional software developed to run inside Mathcad as in the example below.

This software is designed to read a file which was generated in Colorlab by scanning a printed logo and rendering a black and white Postscript file. Then in Microsoft WinWord, the Postscript header and footer are removed, the grayscale text 0–F(hex) is replaced with 0–9(dec) (we have chosen the simplest case of 0–1(dec).), and every other character was replaced by a space so that single digits could be recognized (Set a very large page size in WinWord). There is no loss of resolution, but the number of columns in WinWord doubles (this example was executed at 72 lpi.). The file was stored as lanlblk.prn, a structured Mathcad file of 239 lines by 78/2=39 columns. The Los Alamos logo is rendered below.

$$Q := READPRN(lanlblk) \quad rows(Q) = 239 \quad N := rows(Q) \quad cols(Q) = 39 \quad M := cols(Q)$$

$$i := 0...N-1 \quad j := 0...M-1 \quad k_1 := N-1-i$$

$$QR_{k_1,j} := \text{if } (Q_{i,j} \neq 1, -1, -100)$$

$$PRNCOLWIDTH := 0 \quad PRNPRECISION := 4 \quad WRITEPRN(QRS2) := QR_{i,j} \quad Mt := READPRN(QRS2)$$

$$X_{i,j} := \text{floor}\left(\frac{4095}{N-1} \cdot i\right) WRITEPRN(XS2) := X_{i,j} \quad Mx := READPRN(XS2)$$

$$Y_{i,j} := \text{floor}\left(\frac{1023}{M-1} \cdot j + 1534\right) \quad WRITEPRN(YS2) := Y_{i,j} \quad My := READPRN(YS2)$$

$$Mxy := augment(Mx, My) \quad Mtxy := augment(Mt, Mxy) \quad WRITEPRN(LA) := Mtxy$$

$$MRtxy := READPRN(LA) \quad entries := rows(MRtxy) \quad entries = 9321$$

Note: the mirror image of QR is required to create the correct registry in the mill file.

Operation (7) can then be done as described above for digital data.

Alternatively, operations (3)–(5) can be skipped, and the greyscale image can be saved as a TIFF (xxx.tif, several flavors), Windows Bitmap (xxx.bmp), Windows Paintbrush (xxx.pcx), TARGA (xxx.tga) or a greyscale Postscript file (xxx.eps). Then, using menu commands inside the software package Mocha Version 1.1, the pixel intensities can be extracted in array format and stored as a comma or space delimited ASCII string file (xxx.dat). Operation (6) can be then accomplished by yet another software routine also written to run inside Mathcad as in the example below.

This program will extract pixel intensity data from a Mocha 1.1 worksheet and produce an Ionmill xxx.prn precursor file for subsequent conversion to an Ionmill xxx.str file. N=# of x elements; M=# of y elements; P=# of pixels=rows(Mt). Initial read file is lanllog.dat. Change as necessary for other file reads. Other changes: WRITEPRN(lanlmoc). We also incorporate a vectorizing routine which reduces the size of the mill files to only the essential pixels.

$N := 35 \quad M := 279 \quad P := N \cdot M \quad i := 0...N-1 \quad j := 0...M-1 \quad k := 0...P-1 \quad a := -100 \quad b := 1$ $Q_{i,j} := READ(decin3)$ $Mt_k := READ(decin3) \quad Mt_k := if \ (Mt_k \leq 130, a, -1) \ rows(Mt) = 9765 \ cols(Mt) = 1$ $X_{i,j} := floor\left[2047 + \left(i - \frac{N+1}{2}\right) \cdot b\right] \quad Y_{i,j} := floor\left[2047 + \left(j - \frac{M+1}{2}\right) \cdot b\right]$ $WRITE(xmoc) := X_{i,j} \quad Mx_k := READ(xmoc) \quad WRITE(ymoc) := Y_{i,j} \quad My_k := READ(ymoc)$ $Mtx := augment(Mt, Mx) \quad Mtxy := augment(Mtx, My) \quad Mtxy := csort(Mtxy, 0)$ $t := Mtxy^{(0)} \quad w_k := if \ (t_k \neq -1, 1, 0) \quad s := \sum_k w_k \quad s = 1457 \quad 1 := 0...s-1$ $\quad\quad\quad WRITE(sig0) := t \quad\quad z_1 := READ(sig0)$ $\xi := Mtxy^{(1)} \quad WRITE(sig1) := \xi \quad x_1 := READ(sig1)$ $\psi := Mtxy^{(2)} \quad WRITE(sig2) := \psi \quad y_1 := READ(sig2)$ $Ntx := augment(z, x) \quad Ntxy := augment(Ntx, y) \quad Ntxy := csort(Ntxy, 1)$ $PRNCOLWIDTH := 0 \quad PRNPRECISION := 4 \quad WRITEPRN(decin3) := Ntxy$ $WRITE(Mttmp) := Mt_k \quad R_{i,j} := READ(Mttmp) \quad rows(R) = 35 \quad cols(R) = 279 \quad p := cols(R)$ $q_j := |j - p + 1| \quad P_{i,q_j} := READ(Mttmp)$ The structure of the PostScript file for use in constructing Ionmill precursor files requires a xxx.eps header containing a "j" by "i" specification of characters. Spaces are then added between characters in a text editor such that the corresponding file size is doubled; e.g., 78×70 goes to 156×70, yet no resolution is lost. These files up to the accommodation limit of the Ionmill software can then be processed. Note however, that scanned images of text must be rotated +90 degrees in a trigonometry sense, i.e., counterclockwise; otherwise, a very slow matrix transformation function is required to produce the correct orientation for the Ionmill files.

3-D Image Data are actually stored as an etched 3-D structure in a substrate material. All structures in this category can be described mathematically as dependent variable functions of the form $z=t(x,y).$ A further restriction is that, for a given set of x, y values, only one value of t is permitted. Physically, this typically rules out all etching sites not in line of sight of the ion implantation beam with the exception of minor broadening during the etching. Sequential structural implantation from a different orientation would, however, remove the single valued restriction of z.

Single orientation 3-D implanting is usually done by calculating an array z[i,j], plotting its graph for inspection purposes, and creating an ionmill precursor file of the same form as previously described for the cases of digital and alphanumeric data. Subsequent processing to achieve a millstream file is as previously described. A separate software routine for each 3-D shape thus far formed has been written. While the equations for each shape are unique, the mechanics of array indexing, data formatting, and file writing and conversion are the same for all shapes in this category.

Using the techniques described above, one could extend the method to form 3-D shapes according to greyscale or color pixel values extracted from video-generated TIFF, Bitmap, TARGA, or other graphics files. Data from the shapes could be recovered from the depth information available from scanning probe techniques such as atomic force microscopy and scanning tunneling microscopy.

The present invention is more particularly described in the following examples which are intended as illustrative only, since numerous modifications and variations will be apparent to those skilled in the art.

EXAMPLE 1

Figure 2A:
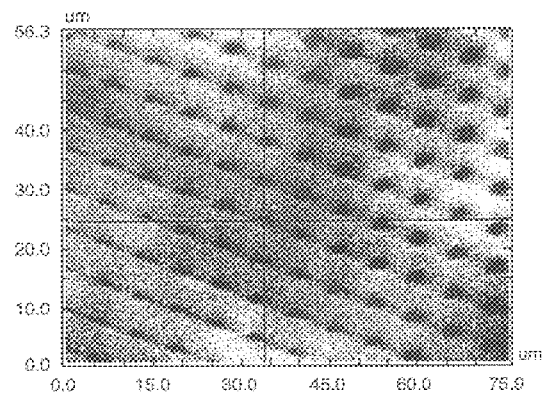
FIG. 2 shows an array of alternating "1" (ion exposure) and "0" (no exposure) with a positive image of pit depth about 2 nanometers.
Figure 1B:
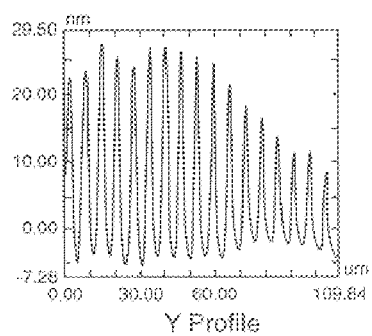
Figure 2B:
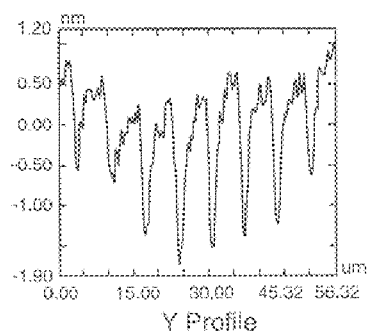

Digital text data were scanned into a data file, converted into the millstream file for recognition by the FEI Ionmill software Version 2.5 of an FEI Ionmill machine and the machine implanted gallium ions (at a level of about $1.7\times10^{12}$ per square centimeter) in the shape of the digital characters onto a silicon substrate. After exposure to the ions, the substrate was placed into an etchant of 50 percent w/w sodium hydroxide at 50° C. for a period of time of about six minutes. The resultant data storage media included characters of size about 5 microns tall. Image recovery was done by red light Mirau interferometry and is shown in FIG. 1 as a negative image. A negative image was done with the same text except using a dosage of gallium ions of about (at a level of about $1.0\times10^{14}$ per square centimeter) whereby the exposed area served as a etch stop and the non-exposed area was etched away, again in about 6 minutes. The positive image is shown in FIG. 2.

EXAMPLE 2

Figure 3:
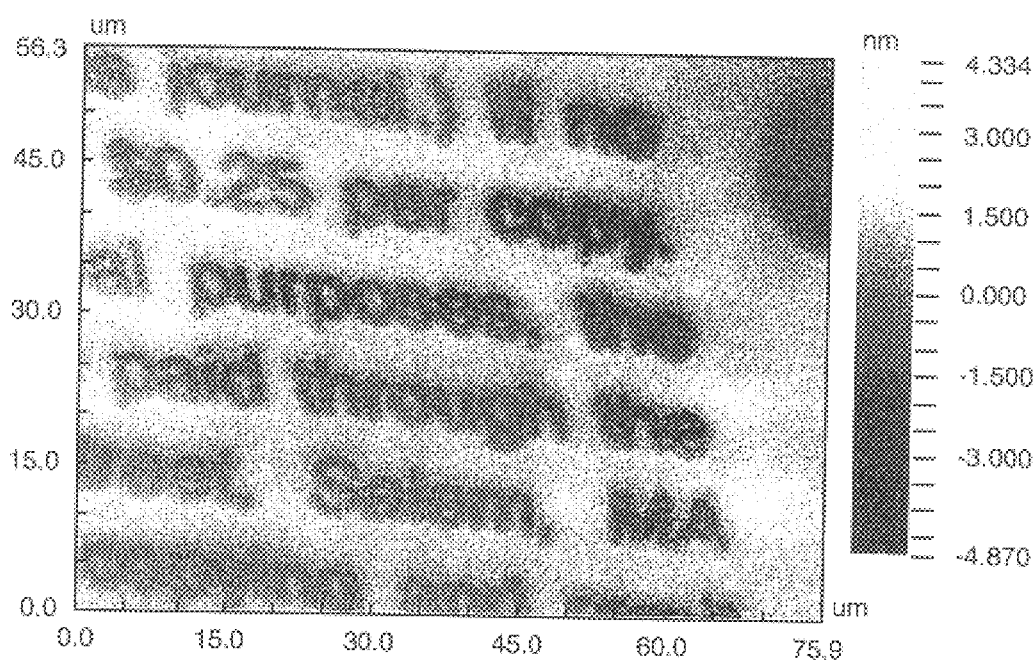
FIG. 3 shows results of a fabrication of analog text data with a positive image wherein character depth is about 9 nanometers.
Figure 4:
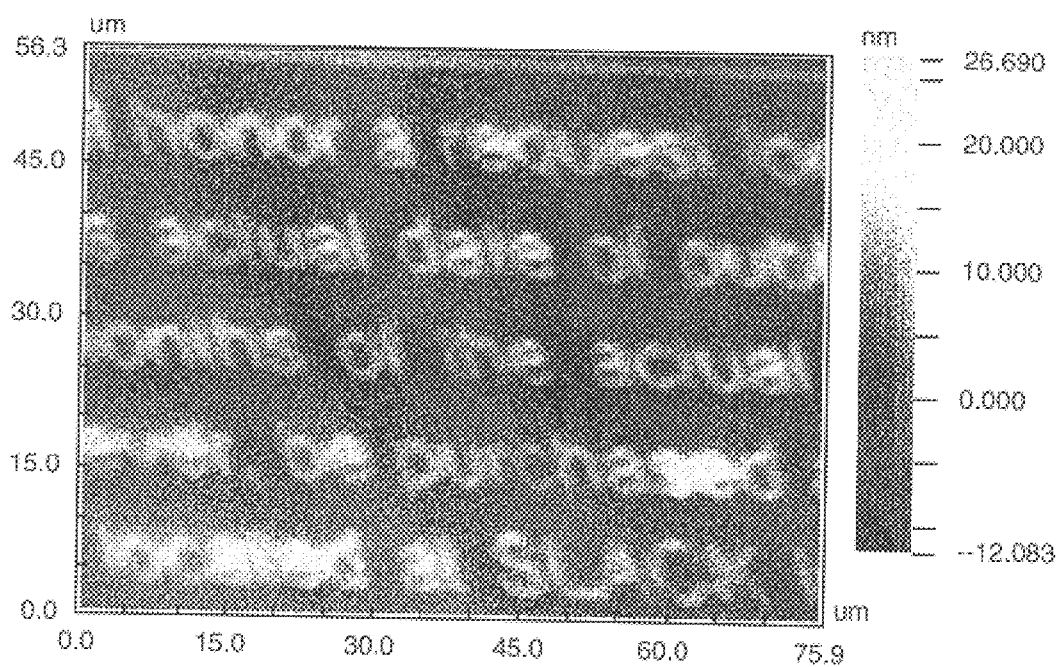
FIG. 4 shows results of a fabrication of analog text data with a negative image wherein character height is about 38 nanometers.

Analog text data (characters 10 points in size) were scanned into a data file, converted into the millstream file for recognition by the software of an FEI Ionmill machine and the machine implanted gallium ions (at a level of about $1.7\times10^{12}$ per square centimeter) in the shape of the analog characters onto a silicon substrate. After exposure to the ions, the substrate was placed into an etchant of 50 percent w/w sodium hydroxide at 50° C. for a period of time of about six minutes. The resultant data storage media included characters of size about 5 microns tall. Image recovery was done by red light Mirau interferometry and is shown in FIG. 3 as a positive image. A negative image was done with the same text except using a dosage of gallium ions of about (at a level of about $1.0\times10^{14}$ per square centimeter) whereby the exposed area served as a etch stop and the non-exposed area was etched away, again in about 6 minutes. The negative image is shown in FIG. 4.

EXAMPLE 3

Figure 5:
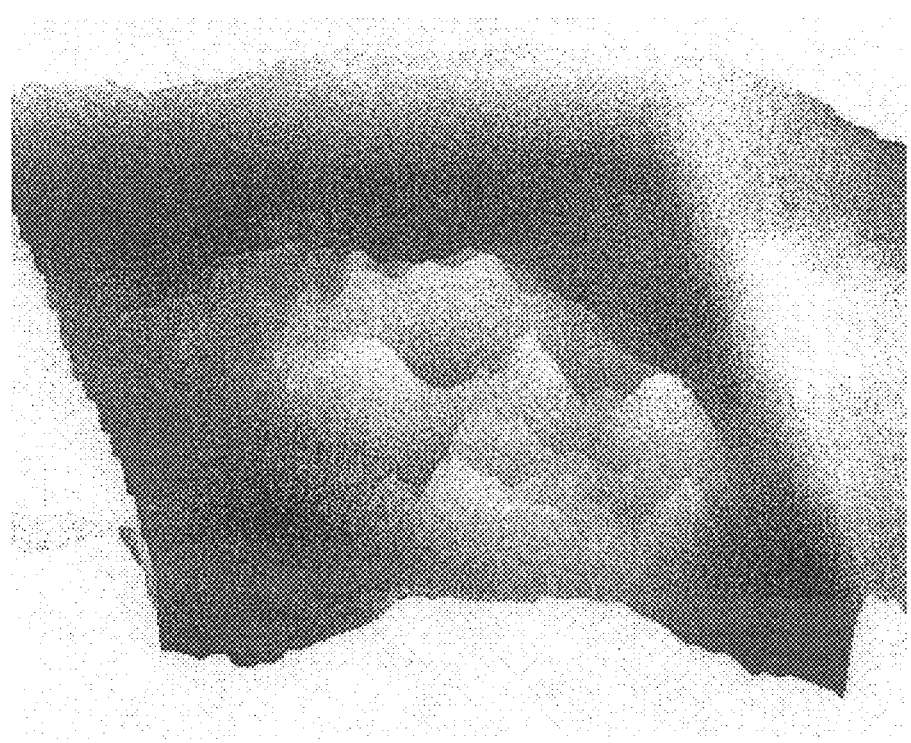
FIG. 5 shows results of a fabrication of an analog image of a 3 dimensional pixel data corresponding to a portrait.
Figure 6:
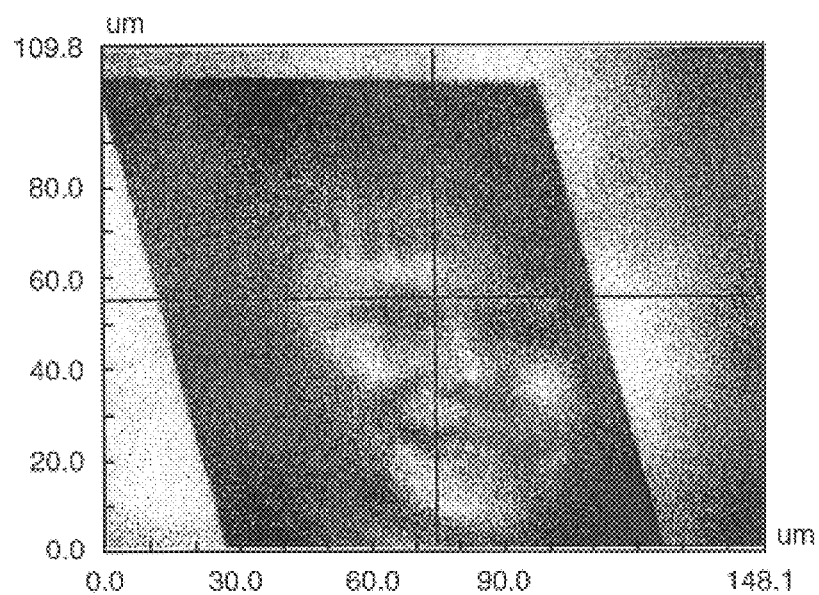
FIG. 6 shows a positive greyscale portrait with contrast resolved according to the etched depth.

Analog image data or pictorial data were scanned into a data file, converted into the millstream file for recognition by the software of an FEI Ionmill machine and the machine implanted gallium ions (at a level of from about $2.8\times10^{13}$ per square centimeter to about $6.8\times10^{13}$ per square centimeter) in the shape of the analog characters onto a silicon substrate. After exposure to the ions, the substrate was placed into an etchant of 50 percent w/w sodium hydroxide at 50° C. for a period of time of about six minutes. The resultant data storage media included areas of varying depth in relation to the original greyscale shade. Image recovery was done by red light Mirau interferometry and a computer generated map of the profile is shown in FIG. 5. The Mirau interferogram image is shown in FIG. 6 demonstrating the recovery of the pictorial data.

Although the present invention has been described with reference to specific details, it is not intended that such details should be regarded as limitations upon the scope of the invention, except as and to the extent that they are included in the accompanying claims.

What is claimed is:

1. A process of fabricating a durable data storage medium within a target substrate comprising:

placing a target substrate within a vacuum environment;

producing a computer data file adapted for operation of a computer-controlled focused ion beam so as to expose a target substrate to such a computer-controlled focused ion beam;

exposing said target substrate to said computer-controlled focused ion beam, said computer-controlled focused ion beam controlled by software utilizing said computer data file whereby said target substrate has defined portions including measurable dosages of implanted ions; and, placing said target substrate having defined portions including measurable dosages of implanted ions into an etchant for a time sufficient to form said durable data storage medium.

2. The process of claim 1 wherein said measurable dosages of implanted ions serve as an etch stop in said defined portions whereby resultant etched characters are protrusions thereon said substrate.

3. The process of claim 1 wherein said measurable dosages of implanted ions serve as an etch enhancement in said defined portions whereby resultant etched characters are depressions therein said substrate.

4. The process of claim 1 wherein said target substrate is silicon and said etchant is sodium hydroxide.

5. The process of claim 1 wherein said implanted ions are selected from the group consisting of gallium, tin and indium.

6. A process of fabricating a durable data storage medium within a target substrate comprising:

placing a target substrate within a vacuum environment;

producing a control means adapted for operating a focused ion beam so as to expose a target substrate to such a focused ion beam;

exposing said target substrate to said focused ion beam, said focused ion beam controlled by said control means whereby said target substrate has defined portions including measurable dosages of implanted ions; and, placing said target substrate having defined portions including measurable dosages of implanted ions into an etchant for a time sufficient to form said durable data storage medium.

* * * * *